(12) United States Patent
Won et al.

(10) Patent No.: US 10,170,569 B2
(45) Date of Patent: Jan. 1, 2019

(54) THIN FILM TRANSISTOR FABRICATION UTLIZING AN INTERFACE LAYER ON A METAL ELECTRODE LAYER

(71) Applicant: Applied Materials, Inc., Santa Clara, CA (US)

(72) Inventors: Tae Kyung Won, San Jose, CA (US); Dong-kil Yim, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 33 days.

(21) Appl. No.: 15/049,903

(22) Filed: Feb. 22, 2016

(65) Prior Publication Data

US 2017/0243943 A1 Aug. 24, 2017

(51) Int. Cl.
| | |
|---|---|
| *H01L 29/00* | (2006.01) |
| *H01L 29/40* | (2006.01) |
| *H01L 29/786* | (2006.01) |
| *H01L 29/49* | (2006.01) |
| *H01L 29/45* | (2006.01) |

(52) U.S. Cl.
CPC ......... *H01L 29/408* (2013.01); *H01L 29/45* (2013.01); *H01L 29/4908* (2013.01); *H01L 29/786* (2013.01); *H01L 29/7869* (2013.01); *H01L 29/78675* (2013.01)

(58) Field of Classification Search
CPC ... H01L 29/408; H01L 29/45; H01L 29/4908; H01L 29/786; H01L 51/105
See application file for complete search history.

(56) References Cited

U.S. PATENT DOCUMENTS

| | | | |
|---|---|---|---|
| 9,202,925 B2 | 12/2015 | Yamazaki et al. | |
| 9,559,122 B2* | 1/2017 | Lee | ........................ G02F 1/1368 |
| 2013/0277666 A1* | 10/2013 | Choi, II | ............... H01L 27/1225 257/43 |
| 2014/0103338 A1 | 4/2014 | Yamazaki et al. | |
| 2015/0187814 A1 | 7/2015 | Miyairi et al. | |
| 2015/0270407 A1* | 9/2015 | Suzuki | .............. H01L 29/78606 257/43 |
| 2017/0003526 A1* | 1/2017 | Jamshidi Roudbari | ..................... G02F 1/1339 |

* cited by examiner

*Primary Examiner* — Mounir Amer
*Assistant Examiner* — Alexander Belousov
(74) *Attorney, Agent, or Firm* — Patteron + Sheridan LLP

(57) ABSTRACT

Embodiments of the disclosure generally provide methods of forming thin film transistor (TFT) device structure with good interface management between a metal electrode layer and a nearby insulating material so as to provide high electrical performance devices, or for other suitable display applications. In one embodiment, a thin film transistor structure includes a metal electrode layer disposed on a barrier layer formed above a gate insulating material layer, an interface layer disposed on the metal electrode layer, wherein the interface layer is an oxygen free dielectric material layer sized to be formed predominately on the metal electrode layer, and an insulating material layer disposed on the interface layer, wherein the insulating material layer is an oxygen containing dielectric layer.

11 Claims, 4 Drawing Sheets

THIN FILM TRANSISTOR FABRICATION UTLIZING AN INTERFACE LAYER ON A METAL ELECTRODE LAYER

BACKGROUND

Field

Embodiments of the present invention generally relate to methods for forming an interface layer between an insulating layer and a metal electrode layer in thin film transistor device structures. More particularly, embodiments of the invention relate to methods for forming an interface layer on a metal electrode layer for interface protection with minimum impurities diffusion to the metal electrode layer for thin film transistor device structure.

Description of the Related Art

Display devices have been widely used for a wide range of electronic applications, such as TV, monitors, mobile phone, MP3 players, e-book readers, and personal digital assistants (PDAs) and the like. The display device is generally designed for producing desired image by applying an electric field to a liquid crystal that fills a gap between two substrates and has anisotropic dielectric constant that controls the intensity of the dielectric field. By adjusting the amount of light transmitted through the substrates, the light and image intensity, quality and power consumption may be efficiently controlled.

A variety of different display devices, such as active matrix liquid crystal display (AMLCD) or an active matrix organic light emitting diodes (AMOLED), may be employed as light sources for display devices which utilize touch screen panels. In the manufacturing of TFT devices, an electronic device with high electron mobility, low leakage current and high breakdown voltage, would allow more pixel area for light transmission and integration of circuitry, thereby resulting in a brighter display, higher overall electrical efficiency, faster response time and higher resolution displays. Low film qualities of the material layers, such as metal electrode layer with impurities, formed in the device often result in poor device electrical performance and short service life of the devices. Thus, a stable and reliable method for forming and integrating film layers with in a TFT devices becomes crucial to provide a device structure with low film leakage, and high breakdown voltage, for use in manufacturing electronic devices with lower threshold voltage shift and improved the overall performance of the electronic device are desired. In particular, the interface management between a metal electrode layer and the nearby insulating materials becomes critical as improper material selection of the interface between the metal electrode layer and the nearby insulating material may adversely result in undesired elements diffusing into the adjacent materials, which may eventually lead to current short, current leakage or device failure.

Therefore, there is a need for improved methods for good interface management for manufacturing TFT devices that produce improved device electrical performance and device stability.

SUMMARY

Embodiments of the disclosure generally provide methods of forming thin film transistor (TFT) device structures with good interface management between a metal electrode layer and a nearby insulating material layer so as to provide high electrical performance devices, or for other suitable display applications. In one embodiment, a thin film transistor structure includes a metal electrode layer disposed on a barrier layer formed above a gate insulating material layer, an interface layer disposed on the metal electrode layer, wherein the interface layer is an oxygen free dielectric material layer sized to be formed predominately on the metal electrode layer, and an insulating material layer disposed on the interface layer, wherein the insulating material layer is an oxygen containing dielectric layer.

In another embodiment, a method for forming a thin film structure with interface protection includes providing an oxygen free dielectric interface layer on a metal electrode layer disposed on a substrate configured to form a thin film transistor device structure, wherein the metal electrode layer is either a source-drain electrode disposed above an active layer or a gate electrode disposed above a channel region and forming an oxygen containing insulating layer on the metal electrode layer in the thin film transistor device structure.

In yet another embodiment, a thin film transistor structure includes a copper metal electrode layer disposed on a substrate, wherein the metal electrode layer is source-drain electrode disposed above an active layer or a gate electrode disposed above a channel region, a silicon nitride layer disposed on the copper metal electrode layer, and an oxygen containing insulating layer disposed above the silicon nitride layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure generally provide methods of forming an interface layer between a metal electrode layer and an insulating material nearby with robust film structure integration and enhanced electrical performance for display devices. The interface layer may be a silicon containing material with film properties with low likelihood of element diffusion to the metal electrode layer where the interface layer is faced with during thermal cycles of manufacturing the display devices. In one example, the silicon containing layer, such as a silicon nitride layer, may be formed between a metal electrode layer (e.g., a metal gate, a source-drain electrode or other suitable metal structures) and an insulating layer (e.g., a passivation layer, an interlayer insulator, an inter-connection material, or other dielectric materials) with good interface management during thermal cycles of the manufacturing operations so as to prevent elements either from the insulating layer or from the metal electrode layer to cross contaminate to each other. Thus, proper interface management by providing an interface layer between a metal electrode layer and an insulating layer in display devices may efficiently enhance the electrical performance of transistor and diode devices.

Figure 1:
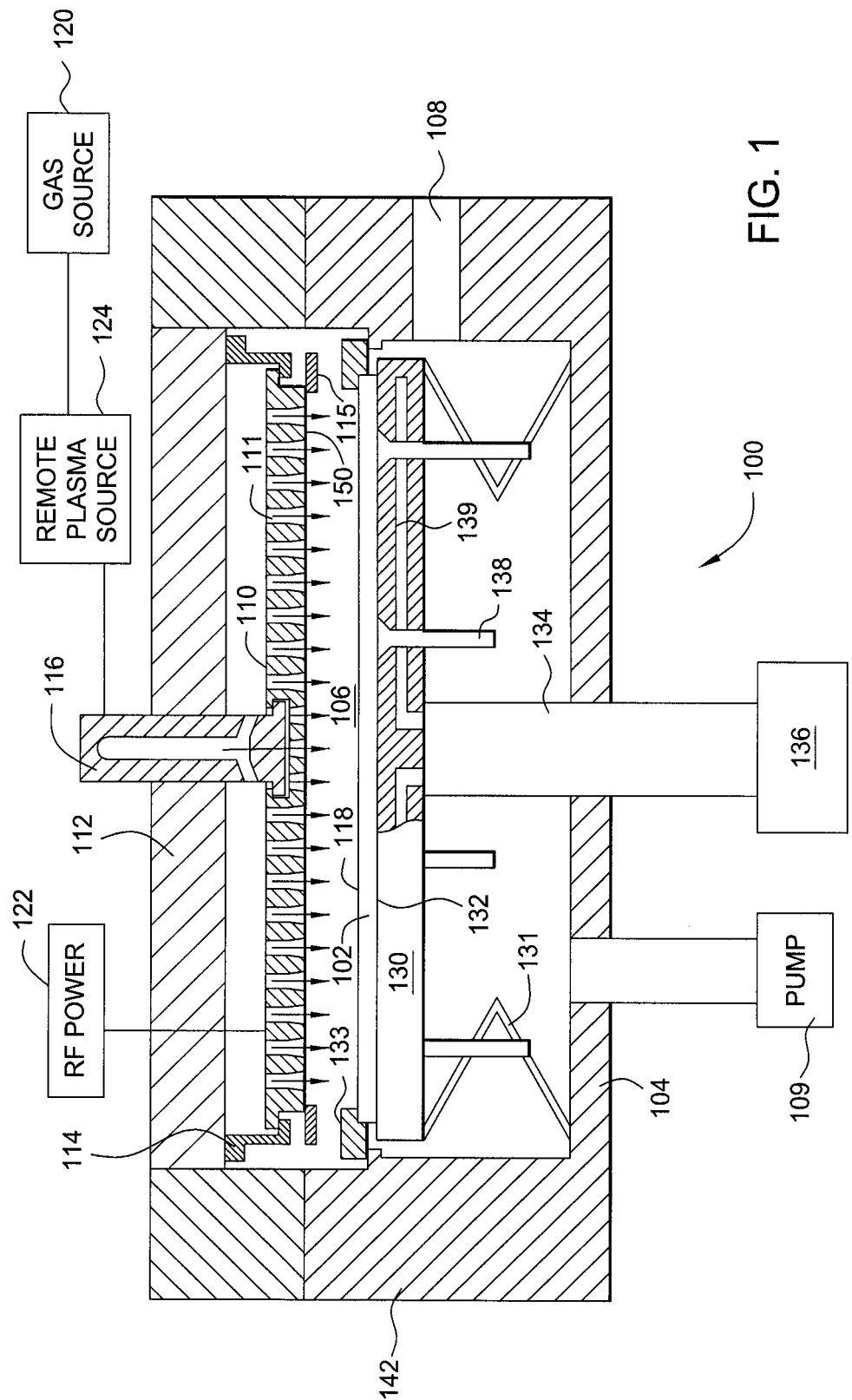
FIG. 1 depicts a sectional view of the processing chamber that may be used to deposit a silicon containing layer in accordance with one embodiment of the present invention.

FIG. 1 is a schematic cross-section view of one embodiment of a plasma enhanced chemical vapor deposition (PECVD) chamber (processing chamber) 100 in which an interface layer, such as a silicon containing layer, an interlayer insulator, or passivation layer in a TFT device structure, may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present disclosure.

The chamber 100 generally includes walls 142, a bottom 104 and a lid 112 which bound a process volume 106. A gas distribution plate 110 and substrate support assembly 130 which define a process volume 106. The process volume 106 is accessed through a valve 108 formed through the wall 142 such that a substrate 102 may be transferred in to and out of the chamber 100.

The substrate support assembly 130 includes a substrate receiving surface 132 for supporting the substrate 102 thereon. A stem 134 couples the substrate support assembly 130 to a lift system 136 which raises and lowers the substrate support assembly 130 between substrate transfer and processing positions. A shadow frame 133 may be optionally placed over periphery of the substrate 102 when processing to prevent deposition on the edge of the substrate 102. Lift pins 138 are moveably disposed through the substrate support assembly 130 and are adapted to space the substrate 102 from the substrate receiving surface 132. The substrate support assembly 130 may also include heating and/or cooling elements 139 utilized to maintain the substrate support assembly 130 at a desired temperature. The substrate support assembly 130 may also include grounding straps 131 to provide an RF return path around the periphery of the substrate support assembly 130.

The gas distribution plate 110 is coupled at its periphery to a lid 112 or wall 142 of the chamber 100 by a suspension 114. The gas distribution plate 110 may also be coupled to the lid 112 by one or more center supports 116 to help prevent sag and/or control the straightness/curvature of the gas distribution plate 110. In one embodiment, the gas distribution plate 110 may have different configurations with different dimensions. In an exemplary embodiment, the gas distribution plate 110 has a quadrilateral plan shape. The gas distribution plate 110 has a downstream surface 150 having a plurality of apertures 111 formed therein facing an upper surface 118 of the substrate 102 disposed on the substrate support assembly 130. The apertures 111 may have different shape, numbers, densities, dimensions, and distributions across the gas distribution plate 110. In one embodiment, the diameter of the apertures 111 may be selected between about 0.01 inch and about 1 inch.

A gas source 120 is coupled to the lid 112 to provide gas through the lid 112, and then through the apertures 111 formed in the gas distribution plate 110 to the process volume 106. A vacuum pump 109 is coupled to the chamber 100 to maintain the gas in the process volume 106 at a desired pressure.

An RF power source 122 is coupled to the lid 112 and/or to the gas distribution plate 110 to provide a RF power that creates an electric field between the gas distribution plate 110 and the substrate support assembly 130 so that a plasma may be generated from the gases present between the gas distribution plate 110 and the substrate support assembly 130. The RF power may be applied at various RF frequencies. For example, RF power may be applied at a frequency between about 0.3 MHz and about 200 MHz. In one embodiment the RF power is provided at a frequency of 13.56 MHz.

In one embodiment, the edges of the downstream surface 150 of the gas distribution plate 110 may be curved so that a spacing gradient is defined between the edge and corners of the gas distribution plate 110 and substrate receiving surface 232 and, consequently, between the gas distribution plate 110 and the upper surface 118 of the substrate 102. The shape of the downstream surface 150 may be selected to meet specific process requirements. For example, the shape of the downstream surface 150 may be convex, planar, concave or other suitable shape. Therefore, the edge to corner spacing gradient may be utilized to tune the film property uniformity across the edge of the substrate, thereby correcting property non-uniformity in the corner of the substrate. Additionally, the edge to center spacing may also be controlled so that the film property distribution uniformity may be controlled between the edge and center of the substrate. In one embodiment, a concave curved edge of the gas distribution plate 110 may be used so the center portion of the edge of the gas distribution plate 110 is spaced farther from the upper surface 118 of the substrate 102 than the corners of the gas distribution plate 110. In another embodiment, a convex curved edge of the gas distribution plate 110 may be used so that the corners of the gas distribution plate 110 are spaced farther than the edges of the gas distribution plate 110 from the upper surface 118 of the substrate 102.

A remote plasma source 124, such as an inductively coupled remote plasma source, may also be coupled between the gas source and the gas distribution plate 110. Between processing substrates, a cleaning gas may be energized in the remote plasma source 124 to remotely provide plasma utilized to clean chamber components. The cleaning gas may be further excited by the RF power provided to the gas distribution plate 110 by the power source 222. Suitable cleaning gases include, but are not limited to, $NF_3$, $F_2$, and $SF_6$.

In one embodiment, the substrate 102 that may be processed in the chamber 100 may have a surface area of 10,000 $cm^2$ or more, such as 25,000 $cm^2$ or more, for example about 55,000 $cm^2$ or more. It is understood that after processing the substrate may be cut to form smaller other devices.

In one embodiment, the heating and/or cooling elements 139 may be set to provide a substrate support assembly temperature during deposition of about 600 degrees Celsius or less, for example between about 100 degrees Celsius and about 500 degrees Celsius, or between about 200 degrees Celsius and about 500 degrees Celsius, such as about 300 degrees Celsius and 500 degrees Celsius.

The nominal spacing during deposition between the upper surface 118 of the substrate 102 disposed on the substrate receiving surface 132 and the gas distribution plate 110 may generally vary between about 400 mil and about 1,200 mil, such as between about 400 mil and about 800 mil, or other distance across the gas distribution plate 110 to provide desired deposition results. In one exemplary embodiment wherein the gas distribution plate 110 has a concave downstream surface, the spacing between the center portion of the edge of the gas distribution plate 110 and the substrate receiving surface 132 is between about 400 mils and about 1400 mils and the spacing between the corners of the gas distribution plate 110 and the substrate receiving surface 132 is between about 300 mils and about 1200 mils.

Figure 2:
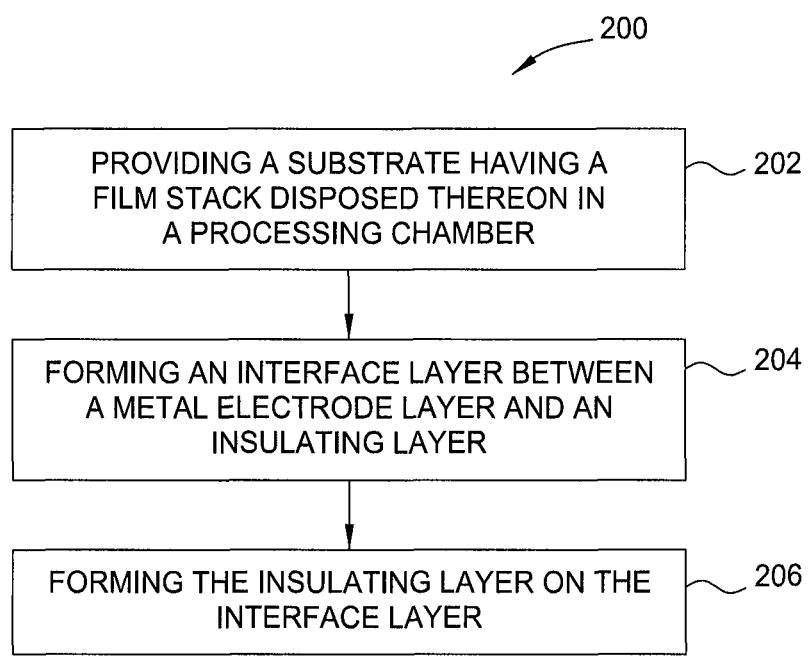
FIG. 2 depicts a process flow diagram of one embodiment of a method of forming an interface layer that may be used in a TFT device structure.

FIG. 2 depicts a flow diagram of one embodiment of a method 200 for forming an interface layer suitable for use as between a metal electrode layer and an insulating material in a thin-film transistor device. The process may be practiced in the processing chamber 100, as described in FIG. 1, or other suitable processing chamber.

Figure 3:
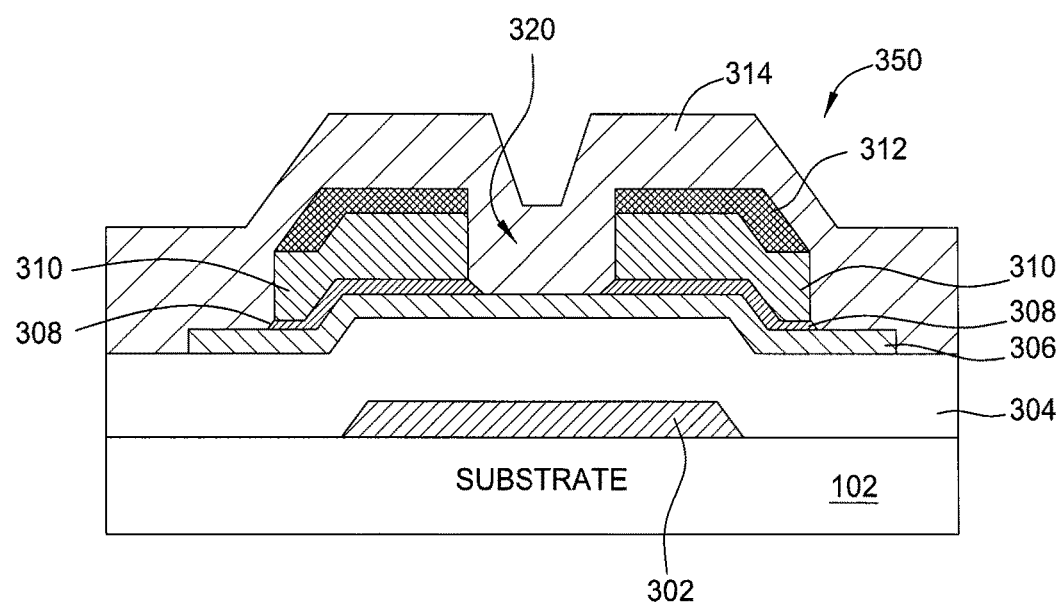
FIG. 3 is a sectional view of one example of a thin film transistor device structure.
Figure 4:
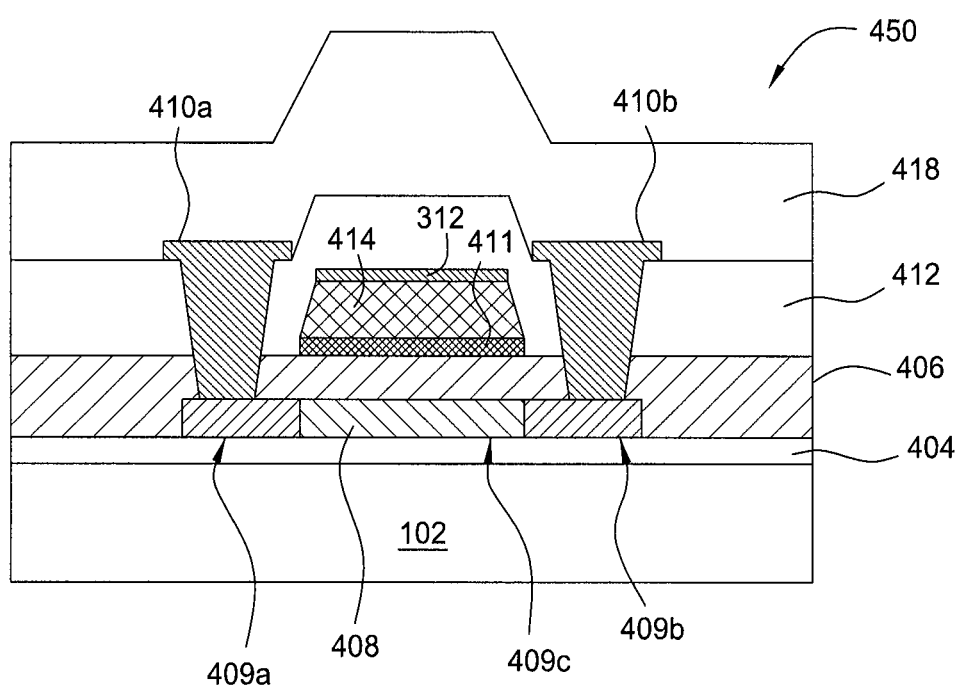
FIG. 4 is a sectional view of another example of a thin film transistor device structure.

The method 200 begins at operation 202 by providing the substrate 102 in a process chamber, such as the processing chamber 100 depicted in FIG. 1. The method 200 may be utilized to form an interface layer between a metal electrode layer and insulating material in a TFT device structure, which will be further described below with referenced to FIGS. 3-4. It is noted that the substrate 102 may have different combination of films, structures or layers previously formed thereon to facilitate forming different device structures or different film stack on the substrate 102. In one example, the substrate 102 may have a device structure 350 formed thereon, as shown in FIG. 3. Alternatively, the substrate 102 may have another device structure 450 disposed thereon, as shown in FIG. 4. The substrate 102 may be any one of glass substrate, plastic substrate, polymer substrate, metal substrate, singled substrate, roll-to-roll substrate, or other suitable transparent substrate suitable for forming a thin film transistor thereon.

In the example depicted in FIG. 3, the thin film transistor device structure 350 is a bottom gate TFT structure disposed on the substrate 102. A gate electrode layer 302 is formed and patterned on the substrate 102 followed by a gate insulator layer 304. In one embodiment, the gate electrode layer 302 may be fabricated from any suitable metallic material, such as aluminum (Al), tungsten (W), chromium (Cr), tantalum (Ta), molybdenum (Mo), copper (Cu) or combination thereof. Suitable materials for the gate insulator layer 304 include silicon oxide ($SiO_2$), silicon oxynitride (SiON), silicon nitride (SiN), and the like. It is noted that the thin film transistor device structure 350 depicted in FIG. 3 is a bottom gate device structure with the gate electrode layer 302 formed on a bottom of the device structure 350.

An active layer 306 is formed on the gate insulator layer 304. The material utilized for the active layer 306 may be selected from a transparent metallic oxide material that has high electron mobility that is suitable low temperature manufacturing that allows flexible substrate materials, such as plastic materials, to be processed at a low temperature without substrate damage. Suitable examples of materials that can be utilized for the active layer 306 include a-IGZO (amorphous indium gallium zinc oxide), InGaZnON, ZnO, ZnON, ZnSnO, CdSnO, GaSnO, TiSnO, CuAlO, SrCuO, LaCuOS, GaN, InGaN, AlGaN or InGaAlN, among others.

After formation of the active layer 306, a barrier layer 308 may be formed on the active layer 306. The barrier layer 308 may be formed from a metal containing material so as to provide a good interface adhesion as well as good barrier properties (e.g., diffusion barrier) to a metal electrode layer 310 (e.g., for a source-drain electrode) subsequently formed thereon. The barrier layer 308 may be patterned to form a desired pattern on the active layer 306 to facilitate transfer of features on the film layers disposed on the substrate 102 in the subsequent etching processes. Although the barrier layer 308 as depicted in FIG. 1 is patterned to a desired pattern, it is noted that the barrier layer 308 could be in any form, including a whole continuous blank film in the device structure 350 or any different features as needed as long as the barrier layer 308 may efficiently provide a blocking/diffusion barrier property to prevent elements from the active layer 306 diffusing into the metal electrode layer 310, or vice versa. In one embodiment, the barrier layer 308 may be a single layer of a metal containing dielectric layer, as depicted in FIG. 3, fabricated by a metal dielectric layer, such as $Ta_2O_5$ or $TiO_2$, or any suitable metal dielectric layer as needed. In another embodiment, the barrier layer 308 may be in form of a composite film as needed.

After the metal electrode layer 310, such as a source-drain metal electrode layer, is disposed over the barrier layer 308, subsequently, an etching process is performed to form a channel 320 in the metal electrode layer 310. After etching, an insulating material layer 314, such as a passivation layer, is then formed over the metal electrode layer 310 to complete the process of forming the thin film transistor device structure 350.

In one embodiment, examples of materials that may be used as the metal electrode layer 310 include copper (Cu), gold, silver (Ag), aluminum (Al), tungsten (W), molybdenum (Mo), chromium (Cr), tantalum (Ta), alloys thereof and combination thereof. Suitable of materials that may be used as the insulating material layer 314 include silicon oxide ($SiO_2$), silicon oxynitride (SiON), or silicon nitride (SiN), and the like.

Furthermore, in another embodiment depicted in FIG. 4, an example of a top gate low temperature polysilicon (LTPS) TFT device structure 450 may be formed on the substrate 102, rather than the bottom gate device structure 350 depicted in FIG. 3. The LTPS TFT devices 450 are MOS devices built with a source region 409a, channel region 408, and drain region 409b formed on the optically transparent substrate 102 with or without an optional insulating layer 404 disposed thereon. The source region 409a, channel region 408, and drain region 409b are generally formed from an initially deposited amorphous silicon (a-Si) layer that is typically later thermal or laser processed to form a polysilicon layer. The source, drain and channel regions 409a, 408, 409b can be formed by patterning areas on the optically transparent substrate 102 and ion doping the deposited initial a-Si layer, which is then thermally or laser processed (e.g., an Excimer Laser Annealing process) to form the polysilicon layer. A gate insulating layer 406 is then deposited on top of the deposited polysilicon layer(s) to isolate a barrier layer 411 and a metal electrode layer 414, such as a gate electrode, disposed thereon from the channel region 408, source region 409a and drain region 409b. The barrier layer 411 may be formed from a metal containing material so as to provide a good interface adhesion as well as good barrier properties (e.g., diffusion barrier) to the metal electrode layer 414 (e.g., the gate electrode) subsequently formed thereon. The barrier layer 411 may be patterned to form a desired pattern on the gate insulating layer 406 to facilitate transfer of features on the film layers disposed on the substrate 102 in the subsequent etching processes. The barrier layer 411 may efficiently provide a blocking/diffusion barrier property to prevent elements from the gate insulating layer 406 diffusing into the metal electrode layer 414, or vice versa. In one embodiment, the barrier layer 411 may be a single layer of a metal containing dielectric layer, as depicted in FIG. 4, fabricated by a metal dielectric layer, such as $Ta_2O_5$ or $TiO_2$, or any suitable metal dielectric layer as needed. In another embodiment, the barrier layer 411 may be in form of a composite film as needed.

The gate electrode layer 414 is formed on top of the gate insulating layer 406 with the barrier layer 411 interposed therebetween. The gate insulating layer 406 is also commonly known as a gate oxide layer since it is commonly made of a silicon dioxide ($SiO_2$) layer. An insulating material layer 412, such as an interlayer insulator, and device connections (not shown) are then made through the insulating material layer 412 to allow control of the TFT devices.

After the insulating material layer 412 is formed, a source-drain metal electrode layer 410a, 410b is then deposited, formed and patterned in the insulating material layer 412. After the source-drain metal electrode layer 410a, 410b is patterned, a passivation layer 418 is then formed over the source-drain metal electrode layer 410a, 410b.

When the substrate 102 is transferred into the processing chamber 100 for a plasma deposition process at operation 202, the substrate 102 includes the device structure 350, 450 in the interim stage of having the metal electrode layer 310, 414 formed and exposed thereon, ready to have an interface layer 312 to be formed thereon in the subsequent operations (e.g., formed at operation 206, which will be described later below), as shown in FIGS. 3-4.

At operation 204, an interface layer deposition process is performed to deposit an interface layer 312 on the metal electrode layer 310, 414, such as the source-drain metal electrode layer 310 in FIG. 3 or the gate electrode layer 414 in FIG. 4. The interface layer 312 may be an oxygen free dielectric material, such as an oxygen free silicon containing layer, selected to provide an interface property that may efficiently protect the interface interfaced with the metal electrode layer 310, 414 to refrain the metal electrode layer 310, 414 from being contaminated or in-purified from other elements in the insulating material layers 314, 412 disposed close by, such as the insulating material layer 314 (i.e., passivation layer) or the interlayer insulator layer 412 subsequently disposed thereon respectively. In one example, the interface layer 312 selected to be formed in the device structures 350, 450 is a silicon nitride layer.

It is believed that the nitrogen elements provided in the interface layer 312 may efficient block the oxygen elements from the insulating material layers 314, 412, as oxygen elements are well known to have good penetration/diffusing energy into a metal layer, especially in a copper material when undergoing cycles of thermal process, such as a deposition process or a thermal treatment process. Thus, by utilizing an oxygen free silicon containing material as the interface layer 312, a robust interface protection may be obtained so as to protect the metal electrode layers 310, 414 from contamination or undesired element diffusion during the subsequent process.

It is noted that the interface layer 312 may have a dimension substantially the same or similar to the metal electrode layer 310, 414 formed on the substrate 102 after any necessary patterning process. The interface layer 312 predominately formed on the surface of the metal electrode layer 310, 414 may provide good interface protection without adversely covering excess regions/surfaces in the device structures 350, 450.

The convention practice often allows a metal electrode layer to be in direct contact with an oxygen containing insulating material, which often results in oxygen elements diffuse and penetrate into the metal electrode layer of copper material. The oxygen impurities penetrated into the copper metal electrode layer may eventually leading to device short, current leakage or device failure, that adversely shorten the lifetime of the device structure. Thus, by utilizing an oxygen free silicon containing interface layer 312, the surface of the metal electrode layer 310, 414 is then interfaced with the oxygen free silicon containing interface layer 312, rather than in direct contact with the insulating material layer 314, 412 so that good interface control may be obtained.

In one example, the interface layer 312 is a silicon nitride layer while the insulating material layer 314, 412 is a silicon oxide layer.

In one example, the interface layer 312 may be formed by supplying a gas mixture into the processing chamber to deposit the oxygen free silicon containing interface layer 312 on the metal electrode layer 310, 414. The gas mixture comprises at least a silicon-based gas, a nitrogen containing gas and an optional inert gas, such as Ar gas. The silicon-based gas is used as a silicon source precursor to provide silicon atoms for forming the oxygen free silicon containing interface layer 312 on the substrate 102. Suitable examples of the silicon-based gas include silane ($SiH_4$), disilane ($Si_2H_6$), silicon tetrafluoride ($SiF_4$), tetraethyl orthosilicate (TEOS), silicon tetrachloride ($SiCl_4$), dichlorosilane ($SiH_2Cl_2$), and combinations thereof. In one example, the silicon-based gas is tetraethyl orthosilicate (TEOS) gas.

Furthermore, a nitrogen containing gas is supplied in the gas mixture to react with the silicon-based gas to form the desired oxygen free silicon containing interface layer 312 on the substrate 102. In the embodiment wherein a silicon nitride layer (SiN) is desired, the nitrogen containing gas provides nitrogen source for forming the silicon nitride layer. Suitable examples of the nitrogen containing gas include $NH_3$, $N_2$, and the like. Inert gas may be used in the gas mixture may include Ar or He.

Specifically, in one example, the volumetric ratio of $N_2$ gas and the $NH_3$ gas to silicon containing gas, such as $SiH_4$, supplied in the gas mixture is between about 1:80 and about 80:1. In one example, the volumetric ratio of the $SiH_4$ gas to the $N_2$ gas (e.g., $SiH_4:N_2+NH_3$) is between 1:1 and 1:60.

While supplying the gas mixture at operation 204, a RF source power is applied to the processing chamber 100 to form a plasma from the gas mixture to deposit the oxygen free silicon containing interface layer 312, such as silicon nitride material. The RF source power is applied to maintain the plasma during deposition. In one embodiment, the RF source power density may be supplied between about 20 $mWatt/cm^2$ and about 1000 $mWatt/cm^2$. The RF source power is provided between about 100 kHz and about 100 MHz, such as about 350 kHz or about 13.56 MHz. Optionally, a RF bias power may also be supplied during the deposition process as needed.

Furthermore, several process parameters may also be controlled during deposition. The spacing of the substrate to the gas distribution plate assembly may be controlled in accordance with the substrate dimension. In one embodiment, the processing spacing for a substrate having a top surface area greater than 1 square meters is controlled between about 400 mils and about 1200 mils, for example, between about 400 mils and about 850 mils, such as 600 mils. The substrate temperature may be controlled at between about 100 degrees Celsius and about 500 degrees Celsius, such as at about 250 degrees Celsius. The process pressure is maintained at between about 0.1 Torr and about 3 Torr, such as about 0.68 Torr.

At operation 206, after the interface layer 312 is formed on the metal electrode layer 310 or 414, the insulating material layer 314 or 412, such as the passivation layer in FIG. 3 or the interlayer insulator in FIG. 4, may be formed on the interface layer 312. In one example, the insulating material layer 314, 412 is an oxygen containing dielectric layer. For example, the insulating material is a silicon oxide layer or silicon oxynitride layer. After the insulating material layer 314, 412 is formed, further materials may be formed thereon to complete the device structure 350, 450 disposed on the substrate 102. In one particular example, the insulating material layer 314, 412 is a silicon oxide layer.

Thus, the methods described herein advantageously improve the electron stability, electrical performance, film structure integration, interface management and protection of electric devices by providing an oxygen free silicon containing interface layer between a metal electrode layer and an insulating material in the device structure so as to eliminate the likelihood of undesired element diffusion/penetration at the device structure interface.

While the foregoing is directed to embodiments of the present invention, other and further embodiments of the invention may be devised without departing from the basic scope thereof, and the scope thereof is determined by the claims that follow.

What is claimed is:

1. A thin film transistor structure, comprising:
    a metal electrode layer disposed on a barrier layer formed above a gate insulating material;
    an interface layer disposed on and in direct contact with the metal electrode layer, wherein the interface layer is an oxygen free dielectric material sized to be formed on and to have the same width as the metal electrode layer; and
    an inorganic insulating material layer disposed on and in direct contact with the interface layer, wherein the inorganic insulating material layer is an oxygen containing dielectric layer.

2. The structure of claim 1, wherein the oxygen free dielectric material layer is a silicon nitride layer.

3. The structure of claim 1, further comprising:
    a passivation layer disposed on the inorganic insulating material layer.

4. The structure of claim 1, wherein the metal electrode layer is a gate electrode layer in a top gate low temperature polysilicon (LTPS) TFT device.

5. The structure of claim 1, wherein the metal electrode layer is a source-drain metal electrode layer disposed above an active layer formed on a gate insulating material layer.

6. The structure of claim 5, wherein the active layer is fabricated from a material selected from a group consisting of a-IGZO (amorphous indium gallium zinc oxide), InGaZnON, ZnO, ZnON, ZnSnO, CdSnO, GaSnO, TiSnO, CuAlO, SrCuO, LaCuOS, GaN, InGaN, AlGaN and InGaAlN.

7. The structure of claim 1, wherein the metal electrode layer is a copper layer.

8. The structure of claim 1, wherein the barrier layer is a metal dielectric layer.

9. The structure of claim 8, wherein the barrier layer includes $Ta_2O_5$ or $TiO_2$.

10. The structure of claim 1, wherein the inorganic insulating material layer is formed from silicon oxide.

11. A thin film transistor structure, comprising:
    a copper metal electrode layer disposed on a substrate, wherein the copper metal electrode layer is source-drain electrode disposed above an active layer;
    a silicon nitride layer disposed on and in direct contact with the copper metal electrode layer, wherein the silicon nitride layer has the same width as the copper metal electrode layer; and
    an oxygen containing inorganic insulating layer disposed above and in direct contact with the silicon nitride layer.

* * * * *